(12) United States Patent
Miyake et al.

(10) Patent No.: US 9,147,621 B2
(45) Date of Patent: Sep. 29, 2015

(54) SEMICONDUCTOR DEVICE COMPONENT AND SEMICONDUCTOR DEVICE

(71) Applicant: KABUSHIKI KAISHA TOSHIBA, Tokyo (JP)

(72) Inventors: Eitaro Miyake, Hyogo (JP); Masashi Aizawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 28 days.

(21) Appl. No.: 14/194,370

(22) Filed: Feb. 28, 2014

(65) Prior Publication Data

US 2015/0077943 A1    Mar. 19, 2015

(30) Foreign Application Priority Data

Sep. 13, 2013   (JP) ................. 2013-190785

(51) Int. Cl.
*H01L 23/02* (2006.01)
*H01L 23/053* (2006.01)
*H01L 23/24* (2006.01)

(52) U.S. Cl.
CPC ............. *H01L 23/053* (2013.01); *H01L 23/24* (2013.01); *H01L 2224/48091* (2013.01); *H01L 2924/1305* (2013.01); *H01L 2924/13055* (2013.01)

(58) Field of Classification Search
CPC .................. H01L 2221/68372; H01L 33/507; H01L 27/6719; H01L 21/52; H01L 21/56; H01L 23/4006

USPC .................. 257/678, 690, 706, 707
See application file for complete search history.

(56) References Cited

U.S. PATENT DOCUMENTS

| 6,421,244 B1 * | 7/2002 | Shinohara et al. ............ 361/736 |
| 6,791,170 B1 * | 9/2004 | Fuku et al. .................... 257/678 |
| 2010/0007026 A1 * | 1/2010 | Shikano ........................ 257/773 |
| 2010/0117216 A1 * | 5/2010 | Lu et al. ........................ 257/692 |
| 2013/0105961 A1 * | 5/2013 | Jones et al. ................... 257/691 |
| 2014/0167241 A1 * | 6/2014 | Matsuoka ..................... 257/690 |
| 2014/0246768 A1 * | 9/2014 | Soyano ......................... 257/691 |

FOREIGN PATENT DOCUMENTS

| JP | H03-38231 | 2/1991 |
| JP | 2004-232745 | 8/2004 |
| JP | 3864130 B2 | 12/2006 |

* cited by examiner

*Primary Examiner* — S V Clark
(74) *Attorney, Agent, or Firm* — Patterson & Sheridan, LLP

(57) ABSTRACT

A semiconductor device component includes a first portion having a first hole usable as a nut insertion hole, and a second portion having a second hole adjacent to the first hole with a wall interposed therebetween. The first hole includes a first surface facing the wall, a second surface adjacent to the first surface, a third surface adjacent to the second surface, a fourth surface adjacent to the third surface and facing the first surface, a fifth surface adjacent to the fourth surface and facing the second surface, and a sixth surface adjacent to the fifth surface and the first surface and facing the third surface. A distance between the first and fourth surfaces is greater than a distance between the second and fifth surfaces, and greater than a distance between the third and sixth surfaces.

17 Claims, 5 Drawing Sheets

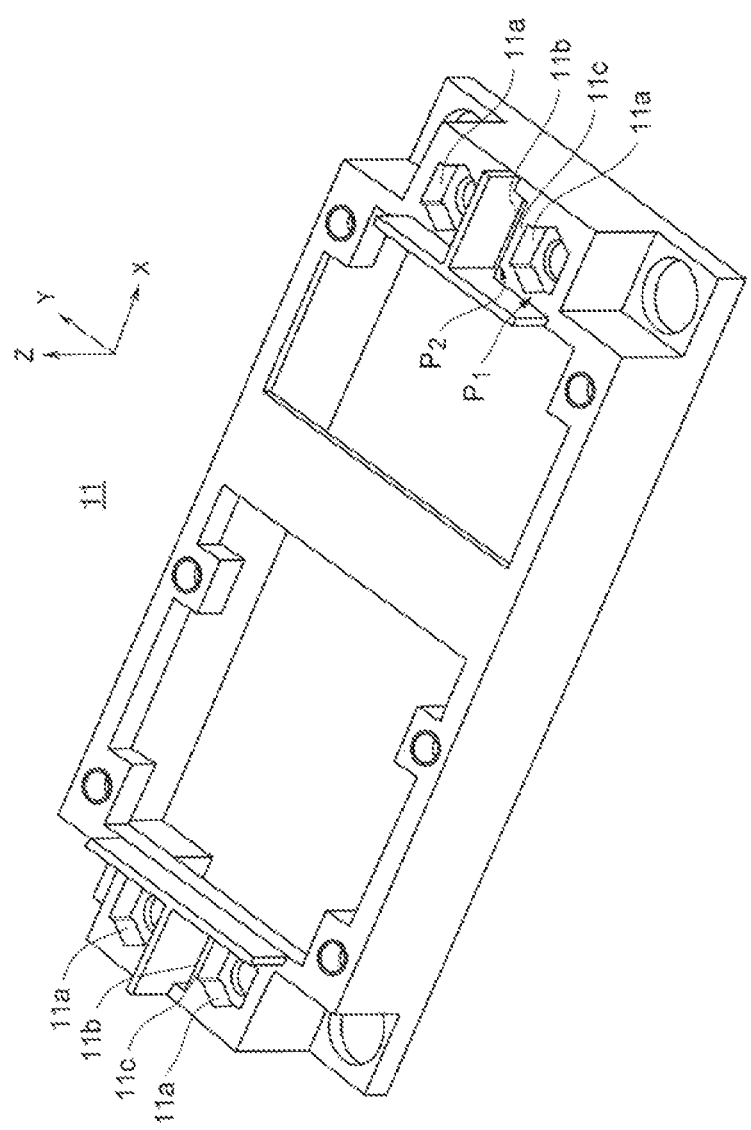

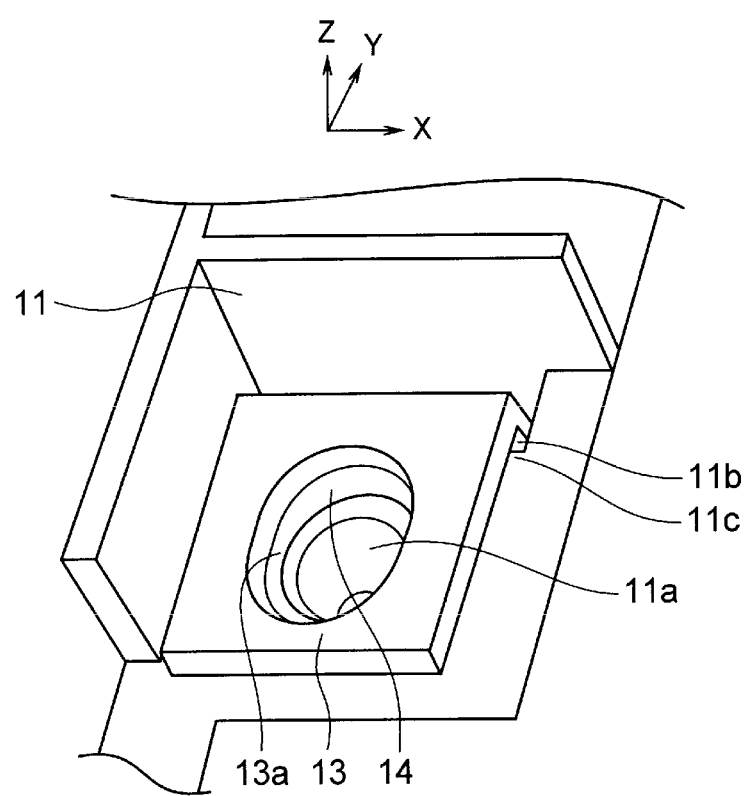

SEMICONDUCTOR DEVICE COMPONENT AND SEMICONDUCTOR DEVICE

CROSS-REFERENCE TO RELATED APPLICATION

This application is based upon and claims the benefit of priority from Japanese Patent Application No. 2013-190785, filed Sep. 13, 2013, the entire contents of which are incorporated herein by reference.

FIELD

Embodiments described herein relate generally to a semiconductor device component and a semiconductor device.

BACKGROUND

The case component of a power semiconductor device is provided with a nut insertion hole for inserting a nut for receipt of a threaded member, such as a bolt or screw, used to attach the terminal of a wire thereto, and a terminal insertion hole for receipt of the wire therethrough. In a case where it is not possible to secure a sufficient distance between the nut insertion hole and the terminal insertion hole, the intermediate wall between the nut insertion and terminal insertion holes becomes thin. As a result, the intermediate wall may not withstand the pressure of a flank or side of the nut bearing thereagainst during screwing of the bolt or screw into the nut, and be damaged. Further, even in a case where a groove for increasing a creepage distance is disposed around the nut insertion hole, the thin intermediate wall adjoins the nut insertion hole, and thus the intermediate wall may be damaged.

DESCRIPTION OF THE DRAWINGS

FIG. 2 is a perspective view illustrating the structure of a case component of the first embodiment.

FIGS. 3A and 3B are perspective views for explaining installation of a nut and a terminal component onto the case component of the first embodiment.

DETAILED DESCRIPTION

Embodiments provide a semiconductor device component and a semiconductor device capable of avoiding damage to a wall adjacent to a hole used as a nut insertion hole.

In general, according to one embodiment, a semiconductor device component includes a first portion that is provided with a first hole usable as a nut insertion hole, and a second portion that is provided with a second hole adjacent to the first hole with a wall interposed therebetween. Further, the first hole includes a first surface that faces the wall, a second surface that is adjacent to the first surface, a third surface that is adjacent to the second surface, a fourth surface that is adjacent to the third surface and faces the first surface, a fifth surface that is adjacent to the fourth surface and faces the second surface, and a sixth surface that is adjacent to the fifth surface and the first surface and faces the third surface. Furthermore, a distance between the first surface and the fourth surface is greater than a distance between the second surface and the fifth surface, and greater than a distance between the third surface and the sixth surface.

Hereinafter, an embodiment of the present disclosure will be described with reference to the accompanying drawings.

First Embodiment

Figure 1:
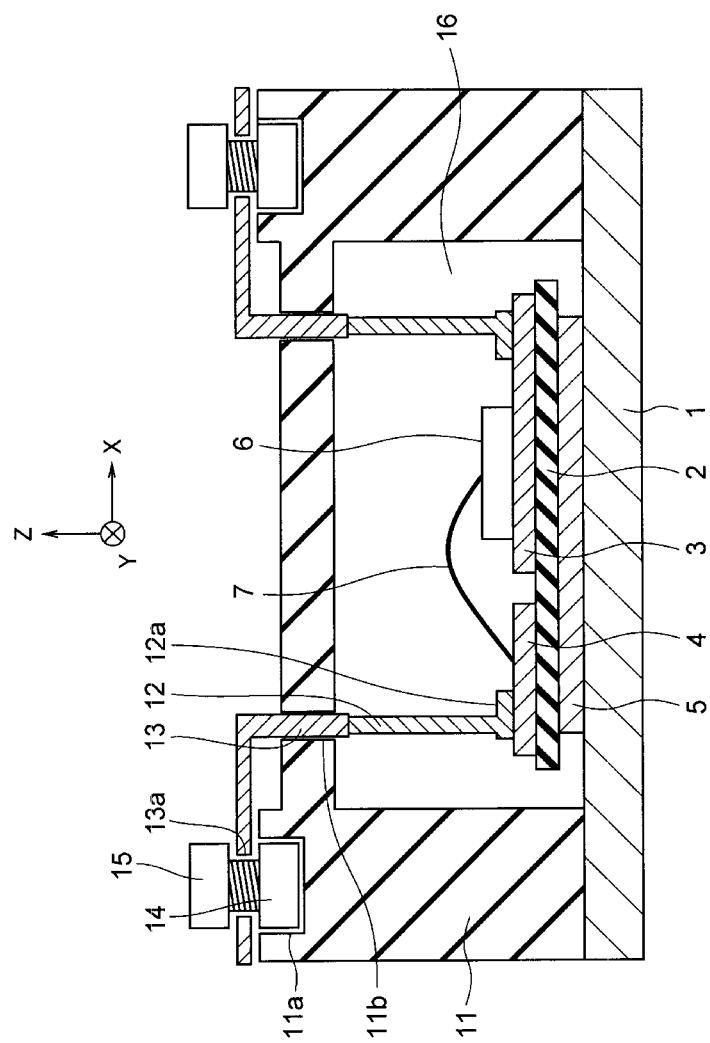
FIG. 1 is a cross-sectional view schematically illustrating the structure of a semiconductor device of a first embodiment.

FIG. 1 is a cross-sectional view schematically illustrating the structure of a semiconductor device of a first embodiment.

The semiconductor device of FIG. 1 includes a heat sink 1, an insulating substrate 2, conductive films 3, 4, and 5, a semiconductor chip 6, a bonding wire 7, a case component 11 which is an example of a semiconductor device component, external wiring 12, a terminal component 13, nuts 14, screws 15, and a sealing resin 16.

The heat sink 1 is a plate member for dissipating heat generated from the semiconductor chip 6. The heat sink 1 is formed of, for example, a metal having high thermal conductivity. FIG. 1 shows an X direction and a Y direction parallel to the surface of the heat sink 1 and perpendicular to each other, and a Z direction perpendicular to the surface of the heat sink 1.

In this specification, the positive side in the Z direction is treated as the upper side, and the negative side in the Z direction is treated as the lower side. For example, the positional relationship between the heat sink 1 and the insulating substrate 2 can be expressed as the heat sink 1 being positioned below the insulating substrate 2.

The insulating substrate 2 has a first principal surface where a circuit pattern is formed by conductive films 3 and 4 and the like, and a second principal surface where a circuit pattern is formed by conductive film 5 and the like. The insulating substrate 2 is, for example, a ceramic substrate. Further, the conductive films 3, 4, and 5 are, for example, metal films. The insulating substrate 2 is disposed on the heat sink 1 such that the first principal surface is directed upward and the second principal surface is directed downward.

The semiconductor chip 6 is disposed on the insulating substrate 2 with the conductive film 3 interposed therebetween. The semiconductor chip 6 is a power semiconductor chip having a power transistor such as an insulated gate bipolar transistor (IGBT). The semiconductor chip 6 is electrically connected to the conductive film 4 by the bonding wire 7.

The case component 11 is installed on the semiconductor chip 6 side of the heat sink 1. The case component 11 of the present embodiment is formed of, for example, a resin. The case component 11 is provided with nut insertion recesses 11a which are examples of a first hole, and terminal component insertion holes 11b which are examples of a second hole. Further, the positions and sizes of the nut insertion recesses 11a and the terminal component insertion holes 11b of FIG. 1 are schematic positions and sizes, and the detailed positions and sizes of them will be described below with reference to FIGS. 2 to 4.

Each external wire 12 comprises wiring for electrically interconnecting the semiconductor chip 6 and an external terminal. A tip portion 12a of each external wire 12 is electrically connected to the conductive film 4.

The terminal component 13 is disposed on the case component 11 with having been inserted into the terminal component insertion holes 11b. Each tip portion of the terminal component 13 is attached to corresponding external wire 12 inside the case component 11. Further, the terminal component 13 is provided with screw insertion holes 13a. The terminal component 13 is disposed on the case component 11 such that its screw insertion holes 13a and the nut insertion recesses 11a overlap each other.

Further, the tip portions of the terminal component 13 may be electrically connected to the external wire 12 through a printed board. In this case, the tip portions of the terminal component 13 may be electrically connected to a plurality of external wire 12 through one printed board. In general, in a case where the external wires 12 are power supply wiring, the tip portions of the terminal components 13 are connected directly to the external wires 12, and in a case where the external wire 12 are signal wiring, the tip portions of the terminal components 13 are connected to the external wires 12 through the printed board.

An internally threaded fastener, such as nuts 14 having opposed flanks are inserted into the nut insertion recesses 11a of the case component 11. Further, the threaded shanks of the screws 15 are fit into the nuts 14 through the screw insertion holes 13a of the terminal components 13. As a result, the position of the terminal component 13 is fixed with respect to the case component 11 by the tightening of the screws 15 into the nuts 14 with the terminal portions 13 squeezed between and held in place by the underside of the head of the screws 15 and the upper surface of the nuts 14. Further, the screws 15 may be fit into the nuts 14 through the screw insertion holes 13a of the terminal component 13 and screw insertion holes (not shown) of the tip portions of cables positioned outside the semiconductor device.

The inner space of the case component 11 is sealed by the sealing resin 16. The sealing resin 16 is, for example, a silicone gel.

FIG. 2 is a perspective view illustrating the structure of the case component 11 of the first embodiment.

As shown in FIG. 2, the case component 11 is provided with a plurality of pairs of the nut insertion recesses 11a and terminal component insertion holes 11b. In each pair thereof, the terminal component insertion hole 11b is adjacent to the nut insertion hole 11a with an intermediate wall 11c interposed therebetween. The intermediate walls 11c of the present embodiment are formed of the same resin as that of the other portions of the case component 11. Further, the thickness of each intermediate wall 11c of the present embodiment is set to be thin, and is set to, for example, 2.0 mm or less. Each intermediate wall 11c is an example of a wall of the present disclosure.

A reference symbol "$P_1$" represents a portion of the case component 11 surrounding the nut insertion hole 11a. Further, a reference symbol "$P_2$" represents a portion of the case component 11 surrounding the terminal component insertion hole 11b. Each portion $P_1$ is an example of a first portion provided in conjunction with a first hole usable as a nut insertion hole. Further, each portion $P_2$ is an example of a second portion provided in conjunction with a second hole.

Figure 3A:
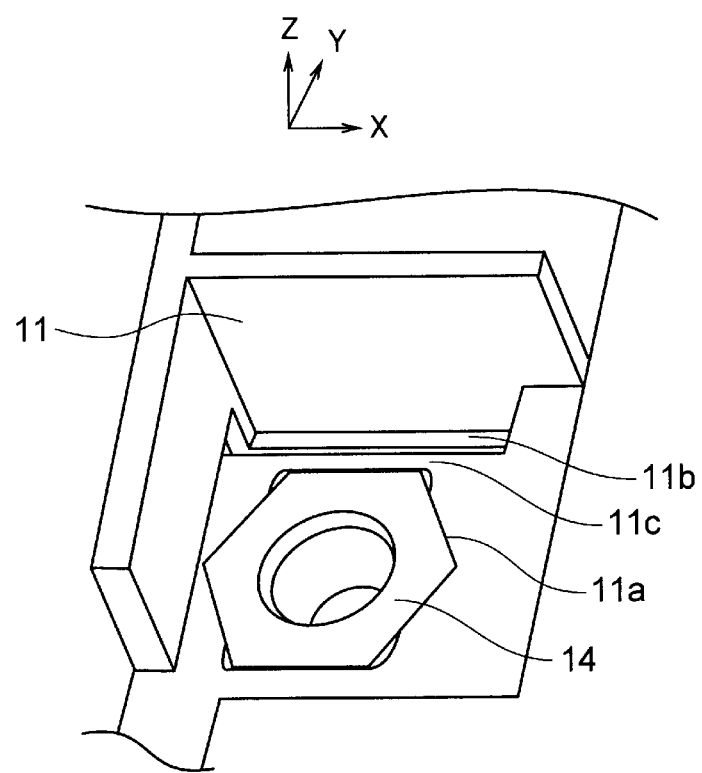

FIGS. 3A and 3B are perspective views for explaining installation of a nut 14 and the terminal component 13 onto the case component 11 of the first embodiment.

FIG. 3A shows a state where a nut 14 has been inserted into the nut insertion hole 11a of the case component 11. Further, FIG. 3B shows a state where the terminal component 13 is disposed on the nut insertion hole 11a into which the nut 14 has been inserted. Thereafter, a screw 15 is fastened to the nut 14 through the screw insertion hole 13a of the terminal component 13, whereby the position of the terminal component 13 is fixed with respect to the case component 11.

Figure 4:
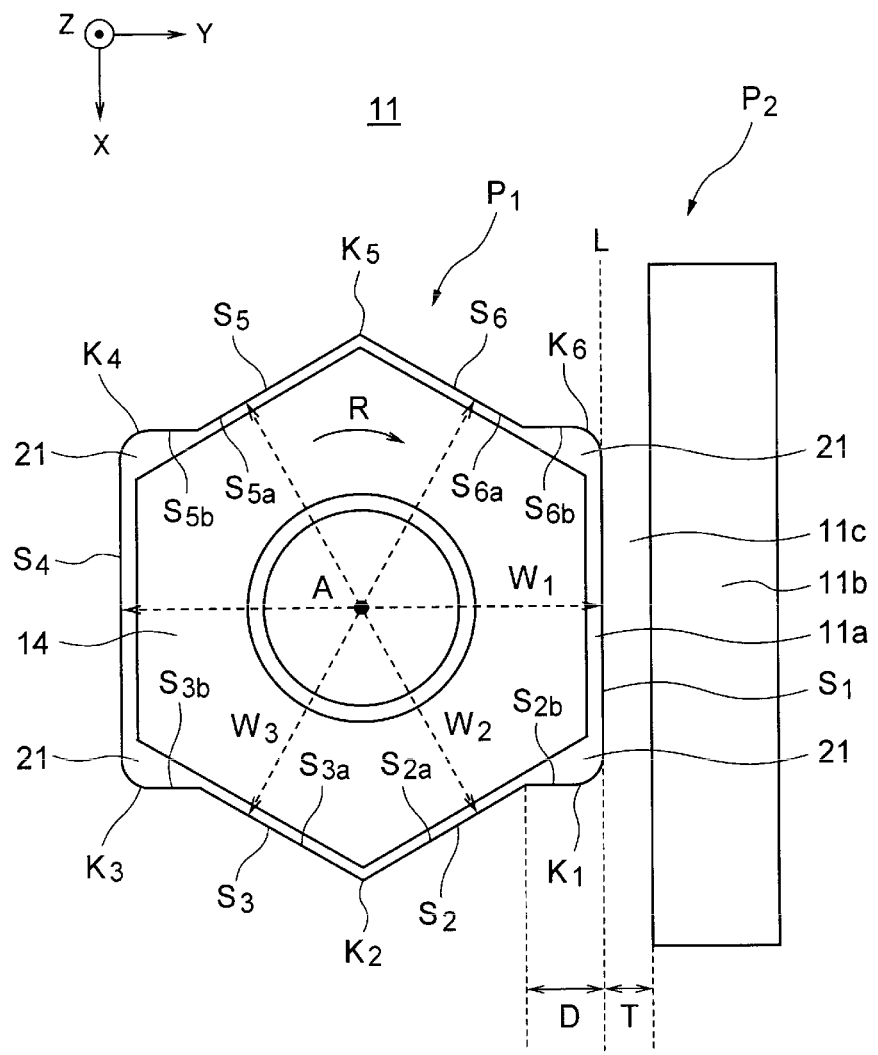
FIG. 4 is a plan view illustrating the structure of the case component of the first embodiment.

FIG. 4 is a plan view illustrating the structure of the case component 11 of the first embodiment. FIG. 4 shows a pairing of a single nut insertion hole 11a and a single terminal component insertion hole 11b.

The nut insertion hole 11a of FIG. 4 has a first surface $S_1$ facing an intermediate wall 11c, a second surface $S_2$ extending from the first surface $S_1$, a third surface $S_3$ extending from the second surface $S_2$, a fourth surface $S_4$ extending from the third surface $S_3$ and also spaced and parallel to the first surface $S_1$, a fifth surface $S_5$ extending from the fourth surface $S_4$ and also spaced and parallel to the second surface $S_2$, and a sixth surface $S_6$ extending from the fifth surface $S_5$ and the first surface $S_1$ and also spaced and parallel to the third surface $S_3$, and the surfaces $S_1$ to $S_6$ provide the perimeter of a hexagonal wall. In a case where a nut 14 formed with a hexagonal outer wall surface has been inserted into the nut insertion hole 11a, the first to sixth surfaces $S_1$ to $S_6$ face the first to sixth outer wall surfaces of the nut 14, respectively.

A reference symbol "$K_1$" represents a corner portion at the intersection of the first surface $S_1$ and the second surface $S_2$, and a reference symbol "$K_2$" represents a corner portion at the intersection of the second surface $S_z$ and the third surface $S_3$. Further, a reference symbol "$K_3$" represents a corner portion at the intersection of the third surface $S_3$ and the fourth surface $S_4$, and a reference symbol "$K_4$" represents a corner portion at the intersection of the fourth surface $S_4$ and the fifth surface $S_5$. Further, a reference symbol "$K_5$" represents a corner portion at the intersection of the fifth surface $S_5$ and the sixth surface $S_6$, and a reference symbol "$K_6$" represents a corner portion at the intersection of the sixth surface $S_6$ and the first surface $S_1$.

A reference symbol "T" represents the thickness of the intermediate wall 11c. The thickness T of each intermediate wall 11c of the present embodiment is 2.0 mm or less, and is, for example, 0.9 mm. Further, reference symbol "A" represents the central axis of the nut insertion hole 11a. Further, reference symbol "R" represents the rotation direction of the screw 15 during fastening of the screw 15 to the nut 14.

[Distances $W_1$, $W_2$, and $W_3$]

Reference symbol "$W_1$" represents the distance between the first surface $S_1$ and the fourth surface $S_4$. Reference symbol "$W_2$" represents the distance between the second surface $S_2$ and the fifth surface $S_5$. Reference symbol "$W_3$" represents the distance between the third surface $S_3$ and the sixth surface $S_6$. In the present embodiment, the distance $W_2$ and the distance $W_3$ are the same value, and the distance $W_1$ is longer than the distance $W_2$ or the distance $W_3$ ($W_1 > W_2 = W_3$). The distances $W_2$ and $W_3$ are, for example, 12.0 mm, and the distance $W_1$ is, for example, 12.2 mm.

In the present embodiment, since the distance $W_1$ is longer than the distance $W_2$ or $W_3$, a structure in which when the screw 15 is fastened or loosened, the outer hexagonal wall surfaces of the nut 14 hits only the second, third, fifth, and sixth surfaces $S_2$, $S_3$, $S_5$, and $S_6$, and does not hit the first and fourth surfaces $S_1$ and $S_4$ is created.

Therefore, according to the present embodiment, when the screw 15 is fastened or loosened, it is possible to prevent the nut 14 hitting the intermediate wall 11c (the first surface $S_1$), whereby it is possible to avoid damage to the intermediate wall 11c.

Further, when the screw 15 is fastened or loosened, it is preferable that the nut 14 hits neither the first surface $S_1$ nor the fourth surface $S_4$. The reason is that if the nut 14 strongly impacts the fourth surface $S_4$, the reaction to the hitting may cause the nut 14 to move toward the first surface $S_1$, thereby colliding with the first surface $S_1$, resulting in damage of the intermediate wall 11c. The structure in which the nut 14 does not hit the first and fourth surfaces $S_1$ and $S_4$ can be implemented, for example, by making the distance $W_1$ longer than the distance $W_2$ or $W_3$ and forming the walls of the first and fourth surfaces $S_1$ and $S_4$ to be point-symmetrical with respect to the central axis A of the nut insertion hole 11a.

[Second Surface $S_2$]

The second surface $S_2$ includes a first partial surface $S_{2a}$ and a second partial surface $S_{2b}$.

The first partial surface $S_{2a}$ is a flat surface occupying more than half of the area of the second surface $S_2$. The first partial surface $S_{2a}$ forms one side of the hexagon which is the plane shape of the nut insertion hole 11a. The first partial surface $S_{2a}$ is in contact with the corner portion $K_2$.

The second partial surface $S_{2b}$ is a surface connecting the first partial surface $S_{2a}$ and the first surface $S_1$. The second partial surface $S_{2b}$ is in contact with the corner portion $K_1$. Further, the second partial surface $S_{2b}$ is positioned to extend the nut insertion hole 11a outwardly with respect to the first partial surface $S_{2a}$, i.e., further from Canter point A. As a result, the nut insertion hole 11a includes an outwardly extending notch portion 21 at the corner portion $K_1$. The connection portion between the second partial surface $S_{2b}$ and the first surface $S_1$ is composed of a curved surface as shown in FIG. 4.

In a case where there is no notch portion 21 at the corner portion $K_1$, when the screw 15 is fastened, the nut 14 can press against the wall adjacent the intersection of walls $S_1$ and $S_2$ at corner portion $K_1$. In this case, this pressing force may cause damage to the intermediate wall 11c.

For this reason, in the present embodiment, the notch portion 21 is provided at the corner portion $K_1$, whereby the nut 14 is avoided from hitting the corner portion $K_1$ when the screw 15 is fastened. This has substantially the same effect on integrity of the intermediate wall 11c as an increase in the thickness of the intermediate wall 11c. Therefore, according to the present embodiment, when the screw 15 is fastened into nut 14, it is possible to prevent damage to the intermediate wall 11c at the corner portion $K_1$.

Further, in the present embodiment, since the connection portion between the second partial surface $S_{2b}$ and the first surface $S_1$ is a curved surface, the corner portion $K_1$ is less likely to be damaged. This is the same even with respect to the corner portions $K_3$, $K_4$, and $K_6$ (to be described below). The whole of the second partial surface $S_{2b}$ may be a curved surface, or only a portion of the second partial surface $S_{2b}$ may be a curved surface.

A reference symbol "D" represents the length of the notch portion 21 in the Y direction. In the present embodiment, the length D of the notch portion 21 in the Y direction is about 2.0 mm.

A reference symbol "L" represents a plane along the first surface $S_1$. The second partial surface $S_{2b}$ of the present embodiment does not extend into the intermediate wall 11c of the plane L, and extends only to the nut insertion wall 11a of the plane L. According to the present embodiment, since the second partial surface $S_{2b}$ has this shape, it is possible to avoid the second partial surface $S_{2b}$ from reducing the thickness of the intermediate wall 11c. This is the same even with respect to a second partial surface $S_{6b}$ of the sixth surface $S_6$ (to be described below).

[Fifth Surface $S_5$]

The fifth surface $S_5$ includes a first partial surface $S_{5a}$ and a second partial surface $S_{5b}$, and has a shape in which the first and second partial surfaces $S_{5a}$ and $S_{5b}$ of the fifth surface $S_5$ are point-symmetrical to the first and second partial surfaces $S_{2a}$ and $S_{2b}$ of the second surface $S_2$ with respect to the central axis A of the nut insertion hole 11a, respectively. As a result, the nut insertion hole 11a includes a notch portion 21 at the corner portion $K_4$.

In a case where there is no notch portion 21 at the corner portion $K_4$, when the screw 15 is fastened, the outer wall of the nut 14 presses against the corner portion $K_4$. In this case, the reaction to the pressing force may cause the opposed wall surface of the nut 14 to move toward the first surface $S_1$, thereby impacting the first surface $S_1$, which can result in damage to the intermediate wall 11c.

For this reason, in the present embodiment, the notch portion 21 is provided at the corner portion $K_4$, whereby the nut 14 is prevented from hitting the corner portion $K_4$ when the screw 15 is fastened. Therefore, according to the present embodiment, when the screw 15 is fastened, it is possible to prevent the nut 14 from moving toward the first surface $S_1$, causing damage of the intermediate wall 11c.

[Sixth Surface $S_6$]

The sixth surface $S_6$ includes a first partial surface $S_{6a}$ and the second partial surface $S_{6b}$, and has a shape in which the first and second partial surfaces $S_{6a}$ and $S_{6b}$ of the sixth surface $S_6$ are line-symmetrical (mirror-symmetrical) to the first and second partial surfaces $S_{2a}$ and $S_{2b}$ of the second surface $S_2$, respectively. As a result, the nut insertion hole 11a includes a notch portion 21 at the corner portion $K_6$.

In a case where there is no notch portion 21 at the corner portion $K_6$, when the screw 15 is loosened from the nut 14, the nut 14 presses against the corner portion $K_6$. In this case, the pressing force may damage the intermediate wall 11c.

For this reason, in the present embodiment, the notch portion 21 is provided at the corner portion $K_6$, whereby the nut 14 is prevented from hitting the corner portion $K_6$ when the screw 15 is loosened from the nut 14. Providing the notch has substantially the same effects on the integrity of the intermediate wall 11c as increasing the thickness of the intermediate wall 11c. Therefore, according to the present embodiment, when the screw 15 is loosened from the nut 14, it is possible to prevent damage to the intermediate wall 11c at the corner portion $K_6$.

[Third Surface $S_3$]

The third surface $S_3$ includes a first partial surface $S_{3a}$ and a second partial surface $S_{3b}$, and has a shape in which the first and second partial surfaces $S_{3a}$ and $S_{3b}$ of the third surface $S_3$ are point-symmetrical to the first and second partial surfaces $S_{6a}$ and $S_{6b}$ of the sixth surface $S_6$ with respect to the central axis A of the nut insertion hole 11a, respectively. As a result, the nut insertion hole 11a includes a notch portion 21 at the corner portion $K_3$.

In a case where there is no notch portion 21 at the corner portion $K_3$, when the screw 15 is loosened from the nut 14, the wall of the nut 14 presses against the corner portion $K_3$. In this case, the reaction to this pressing force may cause the nut 14 to move toward the first surface $S_1$, thereby causing the wall on the opposite side of the nut 14 impacting the first surface $S_1$, resulting in damage to the intermediate wall 11c.

For this reason, in the present embodiment, the notch portion 21 is provided at the corner portion $K_3$, and thus the nut 14 is prevented from hitting the corner portion $K_3$ when the screw 15 is loosened from the nut 14. Therefore, according to the present embodiment, when the screw 15 is loosened, it is possible to prevent the nut 14 from moving toward and impacting the first surface $S_1$, causing damage to the intermediate wall 11c.

Further, the nut insertion hole 11a of the present disclosure includes the notch portions 21 at the corner portions $K_1$, $K_3$, $K_4$, and $K_6$; however, it may have notch portions 21 only at one, two, or three corner portions of the corner portions $K_1$, $K_3$, $K_4$, and $K_6$.

[Corner Portions $K_2$ and $K_5$]

The nut insertion hole 11a of the present embodiment includes no notch portions 21 at the corner portions $K_2$ and $K_5$. For this reason, at the corner portion $K_2$, the first partial surface $S_{2a}$ of the second surface $S_2$ extends and blends into the first partial surface $S_{1a}$ of the third surface $S_3$. Further, at the corner portion $K_5$, the first partial surface $S_{5a}$ of the fifth surface $S_5$ extends directly to intersect with the first partial surface $S_{6a}$ of the sixth surface $S_6$.

When the screw 15 is fastened or loosened, even when the nut 14 presses the corner portions $K_2$ and $K_5$, the influence of the pressing force on the intermediate wall 11c is small. Therefore, in the present embodiment, notch portions 21 are not provided at the corner portions $K_2$ and $K_5$. According to the present embodiment, since any notch portions 21 are not provided at the corner portions $K_2$ and $K_5$, it becomes possible to receive the torque of the nut 14 caused by tightening or loosening of the screw 15 therewith by the corner portions $K_2$ and $K_5$.

In the present embodiment, the shapes of the first, second, and third surfaces $S_1$, $S_2$, and $S_3$ are point-symmetrical to the shapes of the fourth, fifth, and sixth surfaces $S_4$, $S_5$, and $S_6$ with respect to the central axis A of the nut insertion hole 11a, respectively. As a result, the nut insertion hole 11a of the present embodiment has a point-symmetrical shape with respect to the central axis A of the nut insertion hole 11a, and is also symmetric around the axis of line $W_1$. This shape of the nut insertion hole 11a has, for example, an advantage in which it is possible to avoid an excessive pressure from being applied to specific positions of the first to sixth surfaces $S_1$ to $S_6$.

As described above, in the nut insertion hole 11a of the present embodiment, the distance $W_1$ between the first surface $S_1$ and the fourth surface $S_4$ is set to be longer than the distance $W_2$ between the second surface $S_2$ and the fifth surface $S_5$, and the distance $W_3$ between the third surface $S_3$ and the sixth surface $S_6$.

Therefore, according to the present embodiment, when the screw 15 is fastened or loosened with the nut 14, it is possible to prevent the nut 14 from hitting the intermediate wall 11c, whereby it is possible to avoid damage to the intermediate wall 11c.

Further, the present embodiment may be applied not only to the intermediate wall 11c between the nut insertion hole 11a and the terminal component insertion hole 11b, but also to an intermediate wall between the nut insertion hole 11a and a hole other than the terminal component insertion hole 11b. As an example of this hole, a groove which is disposed around the nut insertion hole 11a for increasing a creepage distance can be taken. An intermediate wall between the nut insertion hole 11a and a hole other than the terminal component insertion hole 11b is also an example of the wall of this disclosure.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A case for mounting a semiconductor device, comprising a recess and a terminal access opening separated by a dividing wall, a plurality of walls within the recess in mirror symmetry about a center of the recess, one of the walls defining a dividing wall that separates the recess from the terminal access opening,
wherein a first width of the recess measured between the dividing wall and another one of the walls through the center of the recess, is larger than a second width of the recess measured between two other walls of the recess and through the center of the recess.

2. The case of claim 1, wherein the recess is generally hexagonal in profile.

3. The case of claim 2, wherein the recess includes a plurality of notches, each extending outwardly with respect to the center of the recess at an intersection between two of the walls.

4. The case of claim 2, wherein the notches include a first notch at a first intersection between the dividing wall and a first wall, which is one of the walls adjacent to the dividing wall and a second notch at a second intersection between the dividing wall and a second wall, which is another one of the walls adjacent to the dividing wall.

5. The case of claim 4, wherein the notches further include a third notch at a third intersection between a third wall, which is one of the walls that opposes the dividing wall, and a fourth wall, which is one of the walls adjacent to the third wall, and a fourth notch at a fourth intersection between the third wall and a fifth wall, which is another one of the walls adjacent to the dividing wall.

6. A semiconductor device component comprising:
a first portion that is provided with a first hole usable as a nut insertion hole; and
a second portion that is provided with a second hole adjacent to the first hole with a wall interposed therebetween,
wherein the first hole includes
a first surface that faces the wall,
a second surface that is adjacent to the first surface,
a third surface that is adjacent to the second surface,
a fourth surface that adjacent to the third surface and faces the first surface,
a fifth surface that adjacent to the fourth surface and faces the second surface, and
a sixth surface that is adjacent to the fifth surface and the first surface and faces the third surface, and
a distance between the first surface and the fourth surface is greater than a distance between the second surface and the fifth surface, and greater than a distance between the third surface and the sixth surface.

7. The semiconductor device component according to claim 6, wherein
at least one surface of the second, third, fifth, and sixth surfaces includes
a first partial surface that is a flat surface, and
a second partial surface that is a surface connecting the first partial surface to the first or fourth surface, and extends outwardly with respect to the first partial surface.

8. The semiconductor device component according to claim 7, wherein
a connection portion of the second partial surface with the first or fourth surface is a curved surface.

9. The semiconductor device component according to claim 7, wherein an area of the first partial surface is greater than an area of the second partial surface.

10. The semiconductor device component according to claim 9, wherein the first partial surfaces of the second and third surfaces are adjacent and the first partial surfaces of the fifth and sixth surfaces are adjacent.

11. The semiconductor device component according to claim 6, wherein
the shape of the first hole is point-symmetrical with respect to a center of the first hole.

12. A semiconductor device comprising:
a heat sink;

a semiconductor chip that is disposed on the heat sink with an insulating substrate interposed therebetween; and a case component that is provided with a first hole usable as a nut insertion hole and a second hole adjacent to the first hole with a wall interposed therebetween, and that is installed on a semiconductor chip side of the heat sink wherein the first hole includes
  a first surface that faces the wall,
  a second surface that is adjacent to the first surface,
  a third surface that is adjacent to the second surface,
  a fourth surface that is adjacent to the third surface and faces the first surface,
  a fifth surface that is adjacent to the fourth surface and faces the second surface, and
  a sixth surface that is adjacent to the fifth surface and the first surface and faces the third surface, and a distance between the first surface and the fourth surface is greater than a distance between the second surface and the fifth surface, and greater than a distance between the third surface and the sixth surface.

13. The semiconductor device according to claim 12, wherein at least one surface of the second, third, fifth, and sixth surfaces includes
  a first partial surface that is a flat surface, and
  a second partial surface that is a surface connecting the first partial surface to the first or fourth surface, and extends outwardly with respect to the first partial surface.

14. The semiconductor device according to claim 13, wherein
  a connection portion of the second partial surface with the first or fourth surface is a curved surface.

15. The semiconductor device according to claim 13, wherein an area of the first partial surface is greater than an area of the second partial surface.

16. The semiconductor device according to claim 15, wherein the first partial surfaces of the second and third surfaces are adjacent and the first partial surfaces of the fifth and sixth surfaces are adjacent.

17. The semiconductor device according to claim 12, wherein
  the shape of the first hole is point-symmetrical with respect to a center of the first hole.

* * * * *